US 6,744,662 B2

(12) United States Patent
Freitag et al.

(10) Patent No.: US 6,744,662 B2
(45) Date of Patent: Jun. 1, 2004

(54) MAGNETORESISTIVE MEMORY (MRAM)

(75) Inventors: Martin Freitag, Munich (DE); Dietmar Gogl, Essex Junction, VT (US); Heinz Hoenigschmid, Essex Junction, VT (US); Stefan Lammers, South Burlington, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/436,428

(22) Filed: May 12, 2003

(65) Prior Publication Data

US 2003/0206461 A1 Nov. 6, 2003

Related U.S. Application Data

(63) Continuation of application No. PCT/EP01/12622, filed on Oct. 31, 2001.

(30) Foreign Application Priority Data

Nov. 10, 2000 (DE) .......................... 100 55 936

(51) Int. Cl.[7] .............................................. G11C 11/00
(52) U.S. Cl. ................... 365/158; 365/225.5; 365/171
(58) Field of Search ........................ 365/158, 225.5, 365/171, 173

(56) References Cited

U.S. PATENT DOCUMENTS 5,852,574 A * 12/1998 Naji .......................... 365/158
5,902,690 A   5/1999 Tracy et al.
6,351,408 B1  2/2002 Schwarzl et al.
6,522,578 B2 * 2/2003 Poechmueller ............ 365/225.5
2002/0074575 A1 6/2002 Bangert

FOREIGN PATENT DOCUMENTS

DE  198 07 361 A1  8/1998
DE  197 44 095 A1  4/1999
DE  100 43 947 A1  4/2002

OTHER PUBLICATIONS

Parkin, S. S. P. et al.: "Exchange–Biased Magnetic Tunnel Junctions and Application to Nonvolatile Magnetic Random Access Memory (invited)", American Institute of Physics, Journal of Applied Physics, vol. 85, No. 8, Apr. 15, 1999, pp. 5828–5833.

Sousa, R. C. et al.: "Buried Word Line Planarization and Roughness Control for Tunnel Junction Magnetic Random Access Memory Switching", Journal of Applied Physics, American Institute of Physics, vol. 87, No. 9, May 1, 2000, pp. 6382–6384.

* cited by examiner

Primary Examiner—Huan Hoang
(74) Attorney, Agent, or Firm—Laurence A. Greenberg; Werner H. Stemer; Gregory L. Mayback

(57) ABSTRACT

The form of leads of a cell array of a multiplicity of magnetic memory cells is optimized by deviating from a square cross section of the leads in such a way that the magnetic field component of the write currents lying in the cell array plane decreases sufficiently rapidly with increasing distance from the crossover point. The cell array is constructed from a matrix of the column leads and the row leads.

5 Claims, 4 Drawing Sheets

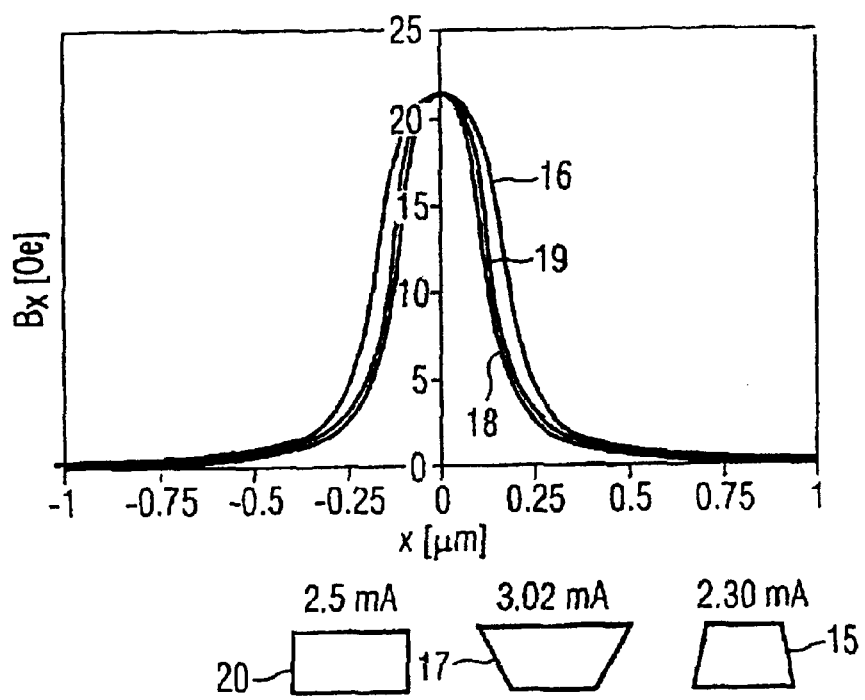

MAGNETORESISTIVE MEMORY (MRAM)

CROSS-REFERENCE TO RELATED APPLICATION

This application is a continuation of copending International Application No. PCT/EP01/12622, filed Oct. 31, 2001, which designated the United States and was not published in English.

BACKGROUND OF THE INVENTION

Field of the Invention

The invention relates to a magnetoresistive memory (MRAM) having a multiplicity of magnetic memory cells, which are disposed at the crossover points of a cell array constructed from a matrix of column and row leads and are connected to the leads, which are provided for conducting read and write currents. In which case, in the event of a write operation, the magnetic fields generated by the write currents in the respective leads are added at a random crossover point and thereby enable a magnetization reverse of the memory cell there.

Such a nonvolatile magnetic random access memory is disclosed for example in Published, Non-Prosecuted German Patent Application DE 198 07 361 A1, corresponding to U.S. Pat. No. 5,902,690.

At the present time, a multiplicity of digital memories are being developed for read and write operations, which memories, as memory chips having a high packing density on a magnetic basis (MRAM), could, at least in some instances, replace the conventional silicon chips (DRAM) as early as in a few years. The MRAM concept provides for a respective bit of information, i.e. the logic zero ("0") or one ("1") state, to be stored in a memory cell which, in principle, contains two magnetized layers, which may be magnetized in a parallel or antiparallel manner with respect to one another. The cell array of the multiplicity of memory cells is constructed from a matrix of column and row leads. The leads contain conductive materials and the actual memory cell is situated at the crossover points of the leads. In order to achieve a change in the magnetization of an individual memory cell, it is necessary to generate a magnetic field, whose strength exceeds a specific threshold value, selectively, that is to say as far as possible only in direct proximity to a freely addressable crossover point. The required magnetic field is achieved in accordance with the customary selection mode only by vector addition of the two magnetic fields that are associated with a specific crossover point and are generated by the column and row leads.

While the outlined principles of the write operations in MRAMs have already been known for a long time, more recently the main emphasis of development has been on progressive read operations. Present-day individual memory cells usually contain at least two magnetic layers separated by an intermediate layer. The individual memory cells are furthermore connected by a matrix of leads. The leads not only serve, as described above, for generating magnetic fields for write operations, rather they also conduct the read currents for reading out the binary information present in the individual memory cells. The magnetic storage state of a memory cell is no longer determined by external magnetic sensors, but rather by measurement of a property, namely of the resistance, at the and through the memory cell itself.

Nowadays consideration is already being given to a plurality of different magnetoresistance effects that are based in each case on different physical principles of action. In practice, what is involved is, in the context of changing the magnetization orientation from parallel to antiparallel and vice versa, the realization of large changes in resistance in the region of a few percent, for example by the giant magnetoresistance effect (GMR) or the tunneling magnetoresistance effect (TMR, other abbreviations are also common).

The general advantage of MRAMs over conventional semiconductor memories consists in the persistent storage of the information. Consequently, after the device in which the memory cells are used has been switched off and switched on again, the stored information is immediately available. Moreover, the energy-expending refresh cycles in silicon chips could also be obviated. In notebooks, for example, the "refresh" necessitates the use of large and heavy rechargeable batteries.

What is problematic in the case of such MRAMs is that magnetic leakage fields from outside the memory or from adjacent cells can cause errors in the memory content if they have a sufficient magnitude. Since magnetic fields can be localized only with difficulty, there is the risk, particularly in the case of high packing densities and, consequently, leads or memory cells lying close together, that the magnetic state and thus the memory content of adjacent cells will be altered.

Therefore, Published, Non-Prosecuted German Patent Application DE 198 07 361 A1 cited in the introduction proposed a shielding layer made of a material having a high permeability. The shielding layer shields external magnetic leakage fields from the coated memory cell and, moreover, concentrates the magnetic fields generated by the write currents at the respective memory cell onto the memory cell, so that a lower current intensity is required to generate a total magnetic field sufficient for writing.

SUMMARY OF THE INVENTION

It is accordingly an object of the invention to provide a magnetoresistive memory that overcomes the above-mentioned disadvantages of the prior art devices of this general type.

With the foregoing and other objects in view there is provided, in accordance with the invention, a magnetoresistive memory. The magnetoresistive memory contains a cell array having a matrix formed of leads including column leads and row leads and a multiplicity of magnetic memory cells disposed at crossover points of the column leads and the row leads. The magnetic memory cells are connected to the column leads and the row leads for conducting read currents and write currents. In an event of a write operation, magnetic fields generated by the write currents in the leads are added at a random crossover point and thereby enable a magnetization reverse of the magnetic memory cell. The leads have a form optimized by deviating from a square cross section thereof in such a way that a magnetic field component lying in a cell array plane decreases sufficiently rapidly with increasing distance from a respective crossover point.

It is an aim of the present invention to configure a magnetoresistive memory (MRAM) of the type mentioned in the introduction in such a way as to produce, without complicated interventions in the fabrication sequence, a controlled, in particular greater, localization of the magnetic field at the respective memory cell, which can thus be addressed with higher selectivity. Moreover, the intention is to be able to generate the magnetic fields as far as possible with a relatively low current intensity.

In the case of a magnetoresistive memory (MRAM) of the type mentioned in the introduction, the aim is achieved according to the invention by virtue of the fact that the form of the leads is optimized by deviation from a square cross section thereof in such a way that the magnetic field component lying in the cell array plane decreases sufficiently rapidly with increasing distance from the crossover point.

Since the use of leads with an approximately square cross section for the construction of an MRAM has been taken as a basis heretofore, the invention is now based on the idea of generating magnetic fields that are localized to a greater extent than heretofore from the outset by optimizing the form of the leads, also resulting at the same time in possibilities for optimizing the required current intensity relative to the demanded threshold value strength and selectivity of the magnetic field.

According to the invention, the new memory structures can be integrated onto the customary wafers e.g. by thin-film technology and optical lithography, a CMOS circuit known per se, for example, on the MRAM chip controlling the read and write operations. Accordingly, the leads of the memory cells are realized by special interconnects made of Cu which are disposed for example between the penultimate and last wiring planes. In terms of the compatibility with the rest of the interconnect system and with regard to properties such as simple producibility or high current-carrying capacity, (approximately) square interconnect cross sections are actually appropriate, but according to the invention a departure is made from these in the direction of a rectangular cross section flattened to a sufficiently great extent.

A particularly advantageous refinement of the MRAM according to the invention consists in using leads having an extremely flat or thin cross section, thereby resulting at the same time in a higher selectivity and lower switching currents. This enables smaller drive circuits and, consequently, also a smaller chip area, less electromigration and lower power consumption. More specifically, the flat rectangular cross-sectional shape has a width at least three times greater than a given height. Alternatively, the leads can have a laterally beveled rectangular cross-sectional shape.

With the foregoing and other objects in view there is provided, in accordance with the invention, a magnetoresistive memory circuit. The magnetoresistive memory circuit contains a semiconductor substrate and a magnetoresistive memory disposed on the semiconductor substrate. The magnetoresistive memory contains a cell array having a matrix formed of leads including column leads and row leads and a multiplicity of magnetic memory cells disposed at crossover points of the column leads and the row leads. The magnetic memory cells connected to the column leads and the row leads for conducting read currents and write currents. In an event of a write operation, magnetic fields generated by the write currents in the leads are added at a random crossover point and thereby enable a magnetization reverse of the magnetic memory cell. The leads have a form optimized by deviating from a square cross section thereof in such a way that a magnetic field component lying in a cell array plane decreases sufficiently rapidly with increasing distance from a respective crossover point. A circuit for generating the read currents and the write currents is integrated in the semiconductor substrate. The circuit has an interconnect system and the leads are integrated into the interconnect system.

Other features which are considered as characteristic for the invention are set forth in the appended claims.

Although the invention is illustrated and described herein as embodied in a magnetoresistive memory (MRAM), it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is a graph showing in an identical illustration to that in FIG. 4, the profile of the magnetic field strength for two further embodiments of the MRAM in accordance with the invention.

DESCRIPTION OF THE PREFERRED EMBODIMENTS

Figure 1:
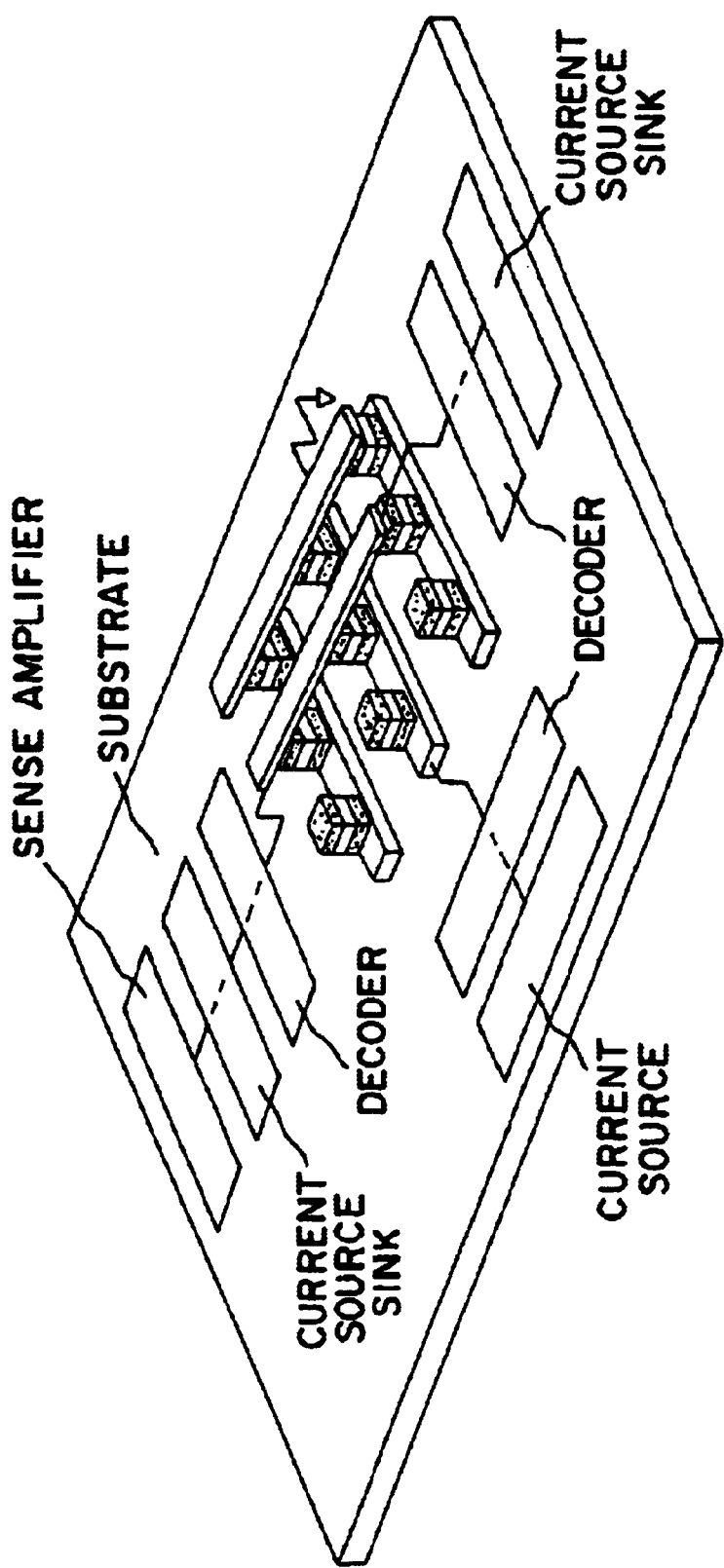
FIG. 1 is a diagrammatic, perspective plan view of a simplified illustration of part of an MRAM matrix in accordance with the invention.

Referring now to the figures of the drawing in detail and first, particularly, to FIG. 1 thereof, there is shown a configuration containing 3×3 memory cells 1 and 2, which are connected by three row leads 3, also called word lines, and by associated column leads 4 (only two leads are illustrated for simplification), also called bit lines. The individual memory cells 1 and 2 may be constructed for example in each case from an upper soft-magnetic layer 5, a lower hard-magnetic layer 6 and a tunnel oxide 7, e.g. $Al_2O_3$, lying in between. The arrows in the two lower memory cells of the foremost column indicate with their parallel or antiparallel magnetization the logic states "1" and "0" of these two memory cells.

A lead form optimization according to the invention is based on the calculation of the associated magnetic field in a manner dependent on a cross-sectional form. First, the magnetic field of a conductor (ideally thin and of infinite length) through which current flows is calculated, this being relatively simple to determine. The following holds true for a magnitude of a magnetic field B at a distance R from the center point of the lead: B=cI/R, where I is the current and C is a constant. The direction of the magnetic field vector can be determined using the so-called "right hand" rule.

Figure 2:
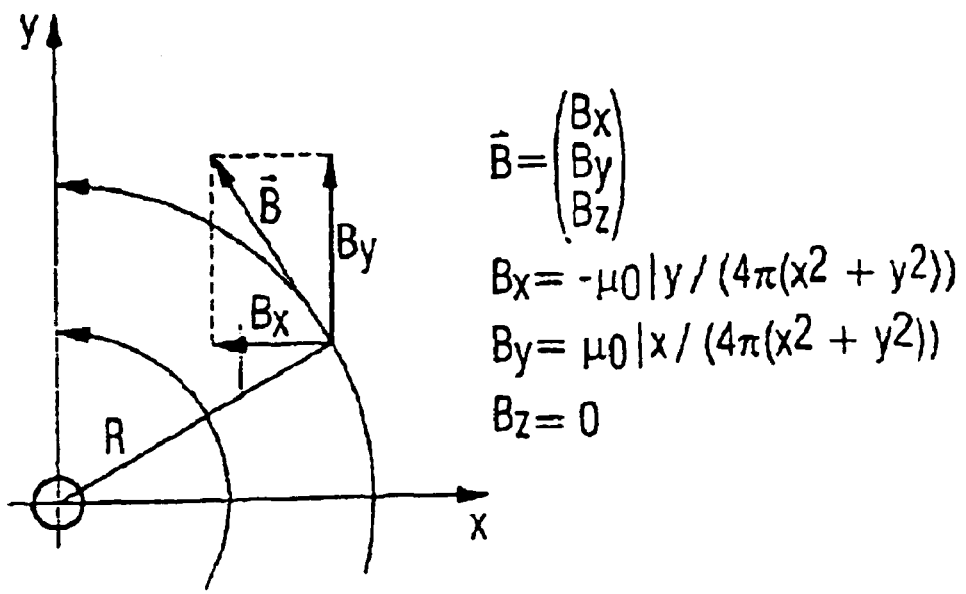
FIG. 2 is a graph showing calculation principles for the magnetic field components with indication of a system of coordinates.

In accordance with the system of coordinates shown in FIG. 2, the z direction is chosen such that the current runs out from the paper plane perpendicularly to the observer. The X-axis can be imagined to run on the top-side of the lead. For the magnetization state of an MRAM memory cell, almost exclusively the magnetic field component in the cell array or wafer plane, that is to say in this case the x-direction, is now important (on account of the demagnetization factors) on the thin magnetic layer. The equations for the magnetic field component $B_x$ can then be established, see FIG. 2, and subsequently also be calculated for an extended (non-idealized) conductor. The splitting of a real conductor having a square cross section (approximately 0.25 $\mu$m×0.25 $\mu$m) into 5×5 "ideal" conductors is indicated in FIG. 3, at the bottom, it being necessary computationally to effect averaging over all the individual magnetic field components $B_x$.

Figure 3:
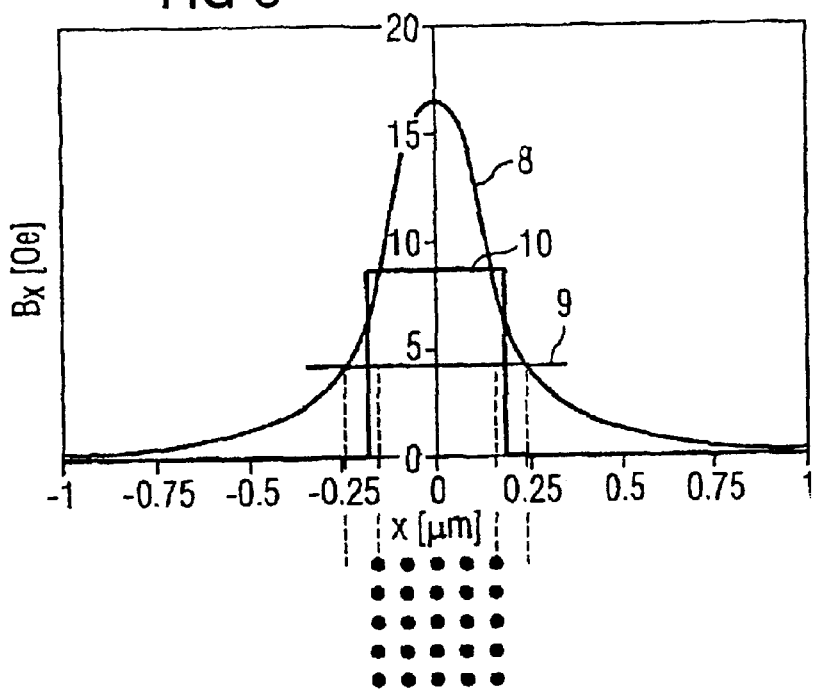
FIG. 3 is a graph showing a profile of the magnetic field strength as a function of a distance x from a center of a lead for an MRAM in accordance with the prior art and also an idealized profile.

Using the example of a known square lead having the dimensions 0.25 $\mu$m×0.25 $\mu$m, FIG. 3 shows the associated real curve 8 of the profile of the magnetic field component $B_x$ (assumptions: I=2.5 mA; y=10 nm). As can be seen, outside the lead considered, e.g. at x=+/−0.25 $\mu$m, that is to say in the intermediate region with respect to the adjacent lead, there is still a leakage field 9 of approximately 4 Oe, which, in accordance with the profile of the real curve 8, falls only relatively slowly toward zero even as the distance x increases still further. What is important in any event is that the magnetic field component $B_x$ directly above the lead reaches a value that is greater than the switching value. This value can be determined for example from the hysteresis curves of the tunnel element. Furthermore, the magnetic field component $B_x$ beside the lead, that is to say already in the immediate vicinity around the crossover point, should have values that are as small as possible, significantly below the switching threshold. This leads to the ideal curve 10 of the magnetic field component $B_x$ depicted in FIG. 3, which falls perpendicularly at the sides.

Figure 4:
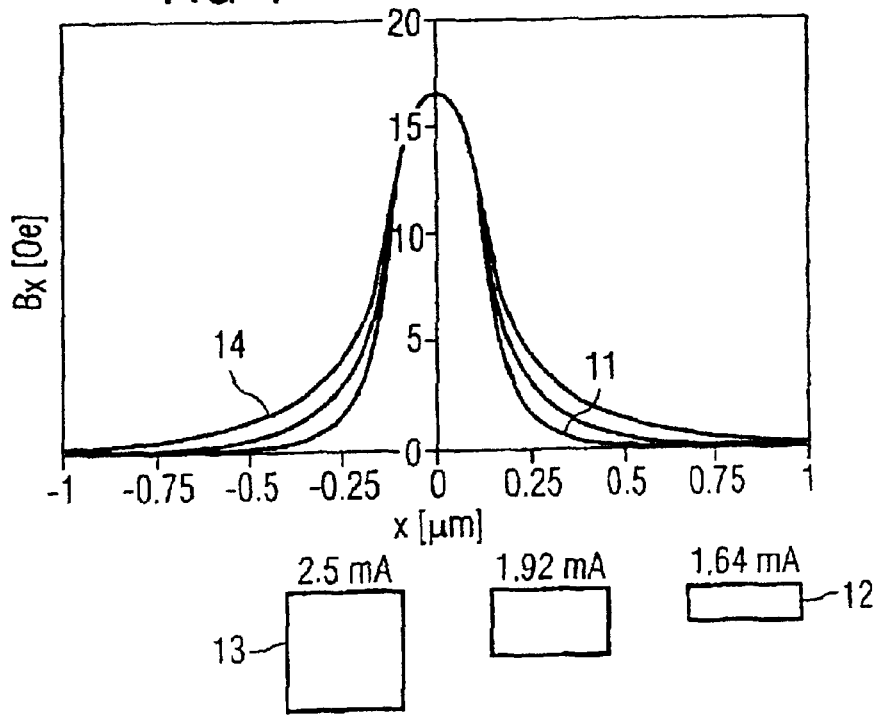
FIG. 4 is a graph showing a profile of the magnetic field strength as a function of the distance x from the center of the lead for an MRAM in accordance with the prior art and also for two embodiments of an MRAM in accordance with the invention.

The calculations now show that the steepest possible fall in the magnetic field component $B_x$ is not fulfilled optimally for a conductor that is cross-sectionally square, but is fulfilled increasingly better for a lead cross section that is flattened in terms of the thickness, as illustrated in FIG. 4. FIG. 4 shows, in particular, a curve 11 corresponding to an extremely flat lead 12; the conductor cross section has decreased significantly (the rectangle of the cross section has a width at least three times greater than its height). However, larger field components are generated in the x direction compared with a square cross section 13, see the associated curve 14, so that, as indicated in FIG. 4, lower switching currents can be used. The generated slopes of the curve 11 and of the middle curve, corresponding to the middle cross section shown, have a significantly steeper profile than in the case of the known square cross section (curve 14), so that better selectivity and, at the same time, lower switching currents are achieved.

All the considerations with regard to the magnetic field component $B_x$ initially apply to an individual lead 3 or 4, but can readily be extended to the vector addition of the two magnetic fields, if appropriate also to configurations with more than two write lines.

FIG. 5 shows the results of the calculations of the curves for flat (thin) and additionally beveled or for trapezoidal lead cross sections. The result for the trapezoidal cross section 15 (curve 16) shows the association of lower switching current together with an only slightly impaired selectivity. The result in the case of the beveled cross section 17 (curve 18) is a very slightly improved selectivity together with a higher switching current. The curve 19, which is shown light in the illustration in FIG. 5, corresponds to the cross section 20 there, or the middle cross section in FIG. 4. The difference in the amplitude of the curve 19 with respect to the middle curve in FIG. 4 results from the higher current intensity of 2.5 mA in FIG. 5, which are chosen as a basis of comparison for the more extensively modified cross sections 15 and 17.

We claim:

1. A magnetoresistive memory, comprising:

a cell array having a matrix formed of leads including column leads and row leads and a multiplicity of magnetic memory cells disposed at crossover points of said column leads and said row leads, said magnetic memory cells connected to said column leads and said row leads for conducting read currents and write currents, in an event of a write operation, magnetic fields generated by the write currents in said leads are added at a random crossover point and thereby enable a magnetization reverse of said magnetic memory cell, said leads having a form optimized by deviating from a square cross section thereof in such a way that a magnetic field component lying in a cell array plane decreases sufficiently rapidly with increasing distance from a respective crossover point.

2. The magnetoresistive memory according to claim 1, wherein said leads have a flat rectangular cross-sectional shape.

3. The magnetoresistive memory according to claim 2, wherein said flat rectangular cross-sectional shape has a width at least three times greater than a given height.

4. The magnetoresistive memory according to claim 2, wherein said leads have a laterally beveled rectangular cross-sectional shape.

5. A magnetoresistive memory circuit, comprising:

a semiconductor substrate;

a magnetoresistive memory disposed on said semiconductor substrate, said magnetoresistive memory containing a cell array having a matrix formed of leads including column leads and row leads and a multiplicity of magnetic memory cells disposed at crossover points of said column leads and said row leads, said magnetic memory cells connected to said column leads and said row leads for conducting read currents and write currents, in an event of a write operation, magnetic fields generated by the write currents in said leads are added at a random crossover point and thereby enable a magnetization reverse of said magnetic memory cell, said leads having a form optimized by deviating from a square cross section thereof in such a way that a magnetic field component lying in a cell array plane decreases sufficiently rapidly with increasing distance from a respective crossover point; and a circuit for generating the read currents and the write currents integrated in said semiconductor substrate, said circuit having an interconnect system and said leads integrated into said interconnect system.

* * * * *